US006501661B1

(12) United States Patent
Moore et al.

(10) Patent No.: US 6,501,661 B1
(45) Date of Patent: Dec. 31, 2002

(54) ELECTRONIC CONTROL UNIT

(75) Inventors: Kevin D. Moore, Hoffman Estates, IL (US); Thomas P. Gall, Northbrook, IL (US); Jeffrey Lord, Schaumburg, IL (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 10/027,443

(22) Filed: Dec. 21, 2001

(51) Int. Cl.[7] ................................................. H05K 5/00
(52) U.S. Cl. ........................ 361/752; 361/749; 361/736
(58) Field of Search ................................. 361/728, 736, 361/749, 750, 762, 788, 791, 793, 627, 636, 638, 640; 174/35 R, 51, 250, 254, 255

(56) References Cited

U.S. PATENT DOCUMENTS

| | | | | |
|---|---|---|---|---|
| 4,025,896 A | * | 5/1977 | Hintze et al. | 340/461 |
| 5,103,375 A | | 4/1992 | Cottingham et al. | |
| 5,159,751 A | | 11/1992 | Cottingham et al. | |
| 5,170,326 A | * | 12/1992 | Meny et al. | 174/254 |
| 5,179,501 A | * | 1/1993 | Ocken et al. | 174/254 |
| 5,216,581 A | * | 6/1993 | Fisher et al. | 361/704 |
| 5,250,845 A | | 10/1993 | Runyan | |
| 5,265,322 A | * | 11/1993 | Fisher et al. | 29/832 |
| 5,386,341 A | | 1/1995 | Olson et al. | |
| 5,434,362 A | | 7/1995 | Klosowiak et al. | |
| 5,969,945 A | | 10/1999 | Cutting et al. | |
| 5,998,738 A | * | 12/1999 | Li et al. | 174/250 |
| 6,292,370 B1 | | 9/2001 | Anderson et al. | |

FOREIGN PATENT DOCUMENTS

| | | |
|---|---|---|
| EP | 0488193 B1 | 5/1995 |
| EP | 0938252 A2 | 8/1999 |

* cited by examiner

Primary Examiner—David Martin
Assistant Examiner—Thanh S. Phan
(74) Attorney, Agent, or Firm—Steven A. May; Thomas V. Miller

(57) ABSTRACT

An electronic control unit (ECU) includes a flexible circuit substrate having a first partition interconnected to a third partition by a second, flexible partition. The electronic control unit further includes a rigidizer having a first partition interconnected to a third partition by a second partition. When the ECU is twice folded, the second, flexible partition of the circuit substrate assumes an approximate 'U'-shape, resulting in a reduced cracking and splitting rate than the prior art. In various embodiments of the present invention, the assumption of a 'U'-shaped fold in the second, flexible partition of the circuit substrate is facilitated by multiple apertures in a second rigidizer partition, by a depression in a second rigidizer partition, or by non-slidably affixing a first circuit substrate partition to a first rigidizer partition via a first adhesive and non-slidably affixing a third circuit substrate partition to a third rigidizer partition via a second adhesive.

19 Claims, 7 Drawing Sheets

ELECTRONIC CONTROL UNIT

FIELD OF THE INVENTION

The present invention relates generally to automotive electronic control units, and, in particular, to use of a flexible circuit that is bent in the assembly of an automotive electronic control unit.

BACKGROUND OF THE INVENTION

Engine mounted electronic control units for automotive engines are disposed in a confined space in an environment subject to high ambient temperatures and extreme vibrations. Typically, in order to enhance thermal performance protect against engine vibrations, a printed circuit board that includes control circuitry is affixed to a rigidizer that may be bent to produce a reduced size module and that also functions as a heat spreader. For example, in a direct engine mount application where a Polybent™ printed circuit board, that is a printed circuit board that has a flexible circuit that is bent, is used for packaging an electronic control unit, the printed circuit board is mounted to an aluminum rigidizer. The rigidizer provides mechanical support for the printed circuit board and assists in the dissipation of heat generated by components on the printed circuit board, which heat is conductively transferred from the components to the underlying rigidizer.

Referring now to FIGS. 1 and 2, an electronic control unit (ECU) 100 of the prior art is illustrated. FIG. 1 is an isometric perspective of an end view of electronic control unit 100. FIG. 2 is a cross-sectional side view of electronic control unit 100. Electronic control unit 100 includes a flexible printed circuit board 104, such as a Polybent™ printed circuit board, that is affixed to a rigidizer 106 by use of a pressure sensitive adhesive (PSA) tape, or film, 202. Typically, circuit board 104 has a number of electronic components 102 mounted on the surface of the circuit board. Adhesive 202 is disposed between rigidizer 106 and printed circuit board 104 and functions to secure the printed circuit board to the rigidizer. After being secured to the rigidizer, the printed circuit board is essentially folded in half, resulting in a folded printed circuit board consisting of two main partitions 204, 208 facing each other and connected to each other by a 'W'-shaped, or serpentine, flexible circuit 206 with a radius of curvature 210 bend that is typically approximately 1 millimeter (mm). For example, circuit substrate 104 may be bent using a Polybent™ process, as described in U.S. Pat. No. 5,998,738, the text of which is hereby incorporated by reference herein.

As the functionality of electronic control units has increased over time, the corresponding circuitry has become increasingly dense and complex. As a result, electronic control units have been migrating from the use of two-layer printed circuit boards, such as printed circuit board 104, to the use of four-layer printed circuit boards. One result of the manufacturing process of four-layer printed circuit boards is a thicker flexible circuit 206, even when the flexible circuit remains a two-layer circuit. Due to the thicker flexible circuit 206, flexible circuit boards are now known to crack and split when bent, resulting a control module that must be discarded. The discarded control modules result in excessive manufacturing costs and waste, especially since the printed circuit boards must be populated with components before being folded.

Therefore, a need exists for a method and apparatus for folding a printed circuit board that will not cause splitting and cracking of the flexible circuit.

DETAILED DESCRIPTION OF THE INVENTION

Figure 1:
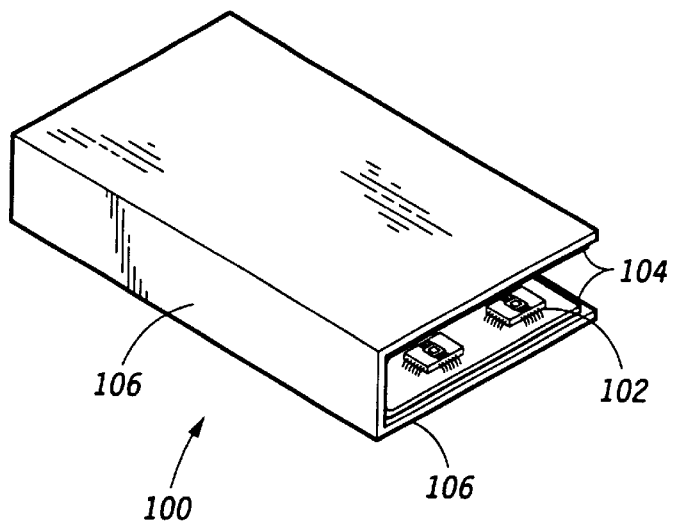
FIG. 1 is an isometric perspective of an end view of an electronic control unit of the prior art.
Figure 2:
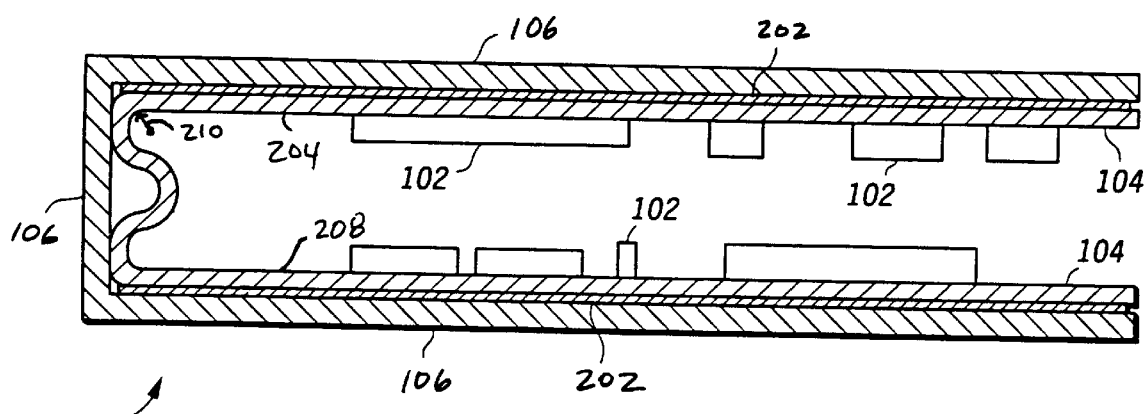
FIG. 2 is a cross-sectional perspective of a side view of the electronic control unit of FIG. 1.

To address the need for a method and apparatus for folding a printed circuit board that will not cause splitting and cracking of the flexible circuit, an electronic control unit (ECU) includes a flexible circuit substrate having a first partition interconnected to a third partition by a second, flexible partition. The electronic control unit further includes a rigidizer having a first partition interconnected to a third partition by a second partition. When the ECU is twice folded, the second, flexible partition of the circuit substrate assumes an approximate 'U'-shape, resulting in a reduced cracking and splitting rate than the prior art. In various embodiments of the present invention, the assumption of a 'U'-shaped fold in the second, flexible partition of the circuit substrate is facilitated by multiple apertures in a second rigidizer partition, by a depression in a second rigidizer partition, or by non-slidably affixing a first circuit substrate partition to a first rigidizer partition via a first adhesive and non-slidably affixing a third circuit substrate partition to a third rigidizer partition via a second adhesive.

Generally, one embodiment of the present invention encompasses an electronic control unit that includes a rigidizer having a first rigidizer partition and a third rigidizer partition interconnected by a second rigidizer partition. The second rigidizer partition includes multiple apertures and multiple bridges that interconnect the first and third rigidizer partitions. The electronic control unit further includes a flexible circuit board having a first circuit board partition and a third circuit board partition that are interconnected by a second, flexible circuit board partition. The first circuit board partition is affixed to a surface of the first rigidizer partition by a first adhesive and the third circuit board partition is affixed to a surface of the third rigidizer partition by a second adhesive. The electronic control unit is folded such that the first rigidizer partition faces the third rigidizer partition and the first rigidizer partition, the second rigidizer partition, and the third rigidizer partition together define an interior region of the rigidizer. When folded, the second circuit board partition attains a 'U'-shape as a result of the folding by extending beyond the interior region of the rigidizer via the multiple apertures in the second rigidizer partition.

Another embodiment of the present invention encompasses an electronic control unit that includes a rigidizer having a first rigidizer partition and a third rigidizer partition interconnected by a second rigidizer partition, wherein the second rigidizer partition includes at least one depression. The electronic control unit further includes a flexible circuit board having a first circuit board partition and a third circuit board partition that are interconnected by a second, flexible circuit board partition. The first circuit board partition is affixed to a surface of the first rigidizer partition by a first adhesive and the third circuit board partition is affixed to a surface of the third rigidizer partition by a second adhesive. The electronic control unit is folded such that the first rigidizer partition faces the third rigidizer partition and the first rigidizer partition, the second rigidizer partition, and the third rigidizer partition together define an interior region of the rigidizer. The second circuit board partition attains a 'U'-shape as a result of the folding by extending into the at least one depression in the second rigidizer partition.

Another embodiment of the present invention encompasses an electronic control unit that includes a rigidizer having a first rigidizer partition and a third rigidizer partition interconnected by a second rigidizer partition. The electronic control unit further includes a flexible circuit board having a first circuit board partition and a third circuit board partition that are interconnected by a second, flexible circuit board partition. The first circuit board partition is non-slidably affixed to a surface of the first rigidizer partition by a first adhesive prior to a folding of the electronic control unit, and the third circuit board partition is slidably affixed to a surface of the third rigidizer partition by a second adhesive prior to the folding of the electronic control unit. The electronic control unit is folded such that the first rigidizer partition faces the third rigidizer partition and the first rigidizer partition, the second rigidizer partition, and the third rigidizer partition together define an interior region of the rigidizer. When folded, the second circuit board partition attains a 'U'-shape by the third circuit board partition sliding along the surface of the third rigidizer partition.

Another embodiment of the present invention encompasses a method for assembling an electronic control unit that includes a flexible circuit board and further includes a rigidizer having a first rigidizer partition, a second rigidizer partition, and a third rigidizer partition, wherein the first and third rigidizer partitions are interconnected by the second rigidizer partition. The method includes steps of applying an adhesive to a surface of the rigidizer, mounting the flexible circuit board flat on the surface of the rigidizer via the adhesive. The method further includes steps of folding the flexible circuit board and the rigidizer such that the first rigidizer partition faces the third rigidizer partition and the first, second, and third rigidizer partitions together define an interior region of the rigidizer, and, in response to the folding of the flexible circuit board and the rigidizer, attaining, by the folded flexible circuit board, a 'U'-shape.

Figure 3:
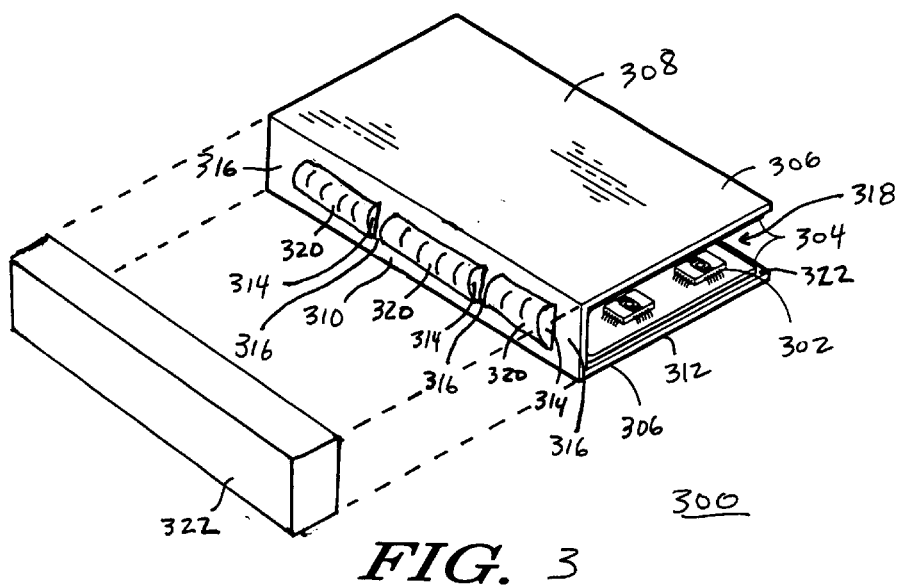
FIG. 3 is an isometric perspective of an end view of an electronic control unit in accordance with an embodiment of the present invention.
Figure 4:
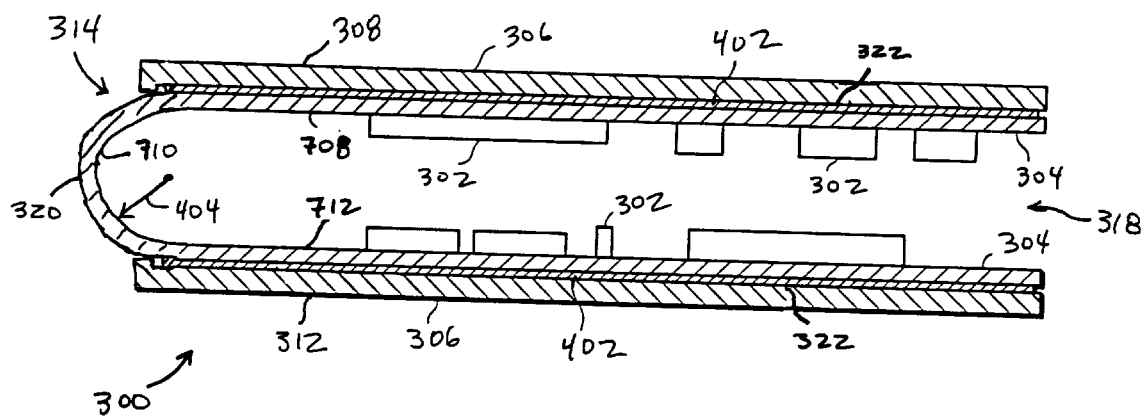
FIG. 4 is a cross-sectional perspective of a side view of the electronic control unit of FIG. 3 in accordance with an embodiment of the present invention.

The present invention may be more fully described with reference to FIGS. 3–12. Referring now to FIGS. 3 and 4, an exemplary electronic control unit 300 for housing a flexible circuit board is illustrated. FIG. 3 is an end view of electronic control unit 300 from an isometric perspective in accordance with an embodiment of the present invention. FIG. 4 is a cross-sectional side view of electronic control unit 300. Control unit 300 includes at least one electronic component 302, a circuit substrate 304, and a rigidizer 306. Electronic component 302 is any electronic component or device that can be mounted to a printed circuit board such as, for example, a battery, a capacitor, a resistor, a semiconductor chip, a diode, an inductor, and a coil. Electronic component 302 is mounted onto a surface of circuit substrate 304, as illustrated in FIGS. 3 and 4. Typically, circuit substrate 304 has a number of electronic components 302 mounted on the surface of the circuit substrate. These electronic components 302 are electrically connected to each other through a number of lands (not shown) and traces (not shown) printed on the surface and on internal layers of circuit substrate 304.

Preferably, circuit substrate 304 is a printed circuit board manufactured from any one of a number of materials known to one of ordinary skill in the art, such as epoxy glass, FR4, and polyimide. In one embodiment of the present invention, circuit substrate 304 is a flat sheet that is formed by conventional methods. Circuit substrate 304 is secured to a surface 322 of rigidizer 306, which surface comprises an inner surface of the rigidizer when the circuit substrate and rigidizer are bent. Circuit substrate 304 is secured to surface 322 by an adhesive 402, preferably a pressure sensitive adhesive (PSA) tape, or film. In another embodiment of the present invention, adhesive 402 may be a heat curable, liquid adhesive that is screen printed on rigidizer 306. Those who are of ordinary skill in the art realize that there are many techniques for securing substrate 304 to surface 322, such as mechanical fasteners such as screws or other adhesive laminates that may be placed on surface 322, that may be used herein without departing from the spirit and scope of the present invention.

Rigidizer 306 surrounds circuit substrate 304 and is designed to shield circuit substrate 304 and electronic components 302 from electrical charge which can damage the circuit substrate and electronic components. Rigidizer 306 also provides mechanical support and conductively dissipates heat for circuit substrate 304. Preferably, rigidizer 306 is manufactured from materials that are rigid enough to provide a rigid mechanical support for the circuit substrate 304, that is, to function as a rigidizer or stabilizer, and that have elements designed to shield the electronic components from heat, water, chemicals, and electrostatic charge, such as aluminum, steel, engineering grade plastic, magnesium, and zinc or any material that is resistant to chemicals and elements commonly found in an automobile. Preferably rigidizer 306 is further manufactured from thermally conductive materials and is conductively transferred heat by components 302 during operation of electronic control unit 300, thereby assisting the components in dissipating the heat. However, those who are of ordinary skill in the art realize that electronic control unit 300 may be used in low power operations where thermal issues, and the thermal conductivity of rigidizer 306, may be of minor importance.

Circuit substrate 304 and rigidizer 306 are bent, or folded, twice. As illustrated in FIGS. 3 and 4, circuit substrate 304 is bent into an approximate 'U' shape. Preferably, circuit substrate 304 and rigidizer 306 are bent using a Polybent™ process, as described in U.S. Pat. No. 5,998,738, the text of which is hereby incorporated by reference herein. The Polybent™ process essentially takes a flat circuit substrate 304 and rigidizer 306 and folds the circuit substrate and rigidizer. While in one embodiment of the present invention circuit substrate 304 and rigidizer 306 are bent using a Polybent™ process, the circuit substrate and rigidizer may be bent using any technique known to one of ordinary skill in the art.

When rigidizer 306 is bent, a first partition 308 of rigidizer 306 faces an opposite, third partition 312 of rigidizer 306. The first and third partitions 310, 312, are interconnected by a second partition 310 of rigidizer 306. The first, second, and third partitions 308, 310 and 312 of rigidizer 306 are configured to define an interior region 318 of rigidizer 306. Second partition 310 of rigidizer 306 includes multiple, preferably three, apertures 314 that facilitate a 'U'-shaped fold in circuit substrate 304 when the substrate and rigidizer are folded, and multiple, preferably four, bridges 316 that interconnect first partition 308 of rigidizer 306 to third partition 312.

Each aperture of the multiple apertures 314 allows for at least a portion 320 of circuit substrate 304 to extend beyond interior region 318 of rigidizer 306 during the folding process, thereby allowing for a 'U'-shaped fold in circuit substrate 304 instead of the 'W'-shaped fold 206 inside of the rigidizer 106 of electronic module 100. By allowing for a 'U'-shaped fold, the multiple apertures 314 permit a larger radius of curvature 404 bend in a flexible circuit 710 portion of circuit substrate 304 as compared to the radius of curvature 210 bend in a similarly-sized electronic module 100 of the prior art. The larger radius of curvature 404 bend, preferably a radius of curvature of approximately 5.8 mm, greatly reduces the rate of splitting and cracking of flexible circuit 710 when circuit substrate 304 is bent. Electronic control unit 300 may also include an end cap 322 that can be slid over second partition 310 of rigidizer 306 and portion 320 of flexible circuit 304 extending beyond interior region 318 of the folded rigidizer 306. End cap 322 prevents elements such as dust, water, and other chemicals from entering rigidizer 306 via the multiple apertures 308 and damaging electronic components 302.

Figure 5:
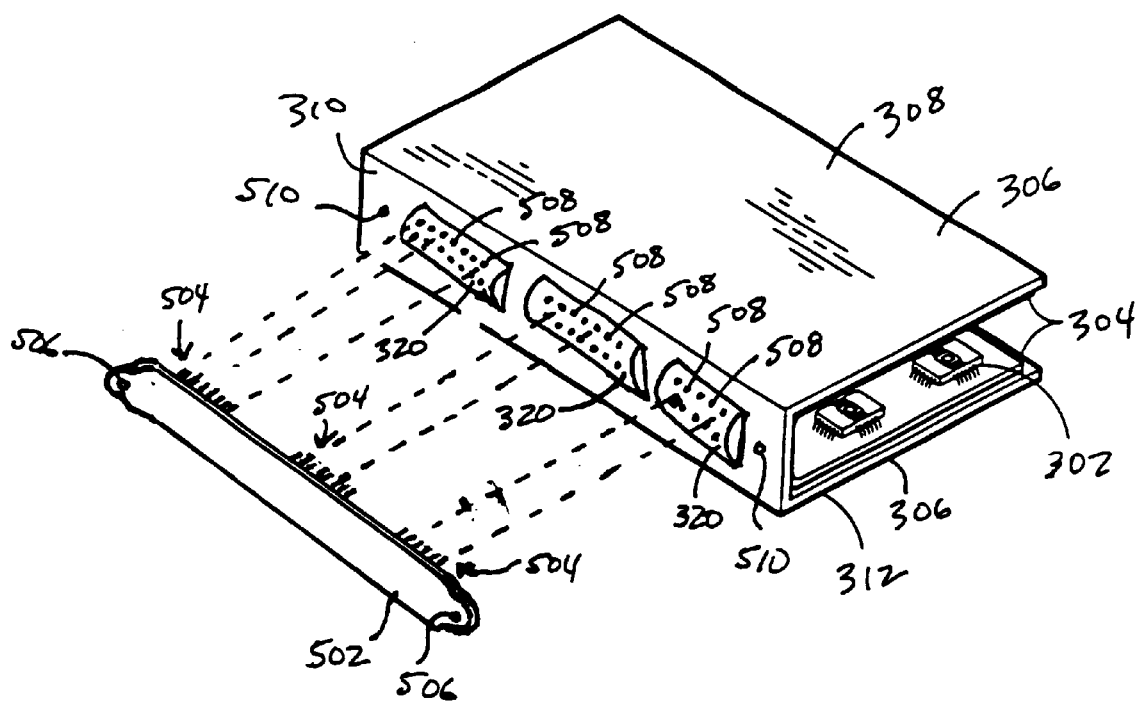
FIG. 5 is an isometric perspective of an end view of an electronic control unit in accordance with another embodiment of the present invention.

Referring now to FIG. 5, a connector 502 may be mounted to portion 320 of circuit substrate 304 extending beyond interior region 318 of rigidizer 306 instead of end cap 322. Connector 502 includes multiple electrically conductive pins 504 and multiple mating apertures 506. In turn, each portion 320 of circuit substrate 304 may include multiple connecting holes 508 for the purpose of receiving the multiple pins 504 of connector 502. Rigidizer 306 may also include multiple mating apertures 510 that align with the multiple mating apertures of connector 502. Each of the multiple connecting holes 508 receives a pin of the multiple pins 504 when the assembly of electronic control unit 100 is completed, thereby providing an electrical interface, via connector 502, between circuit substrate 304 and external electronics. In addition, each of the multiple mating apertures 506 in connector 502 aligns with one of the multiple mating apertures 510 of rigidizer 306 for receiving a fastener that can hold the connector to the rigidizer and to the circuit substrate.

Figure 6:
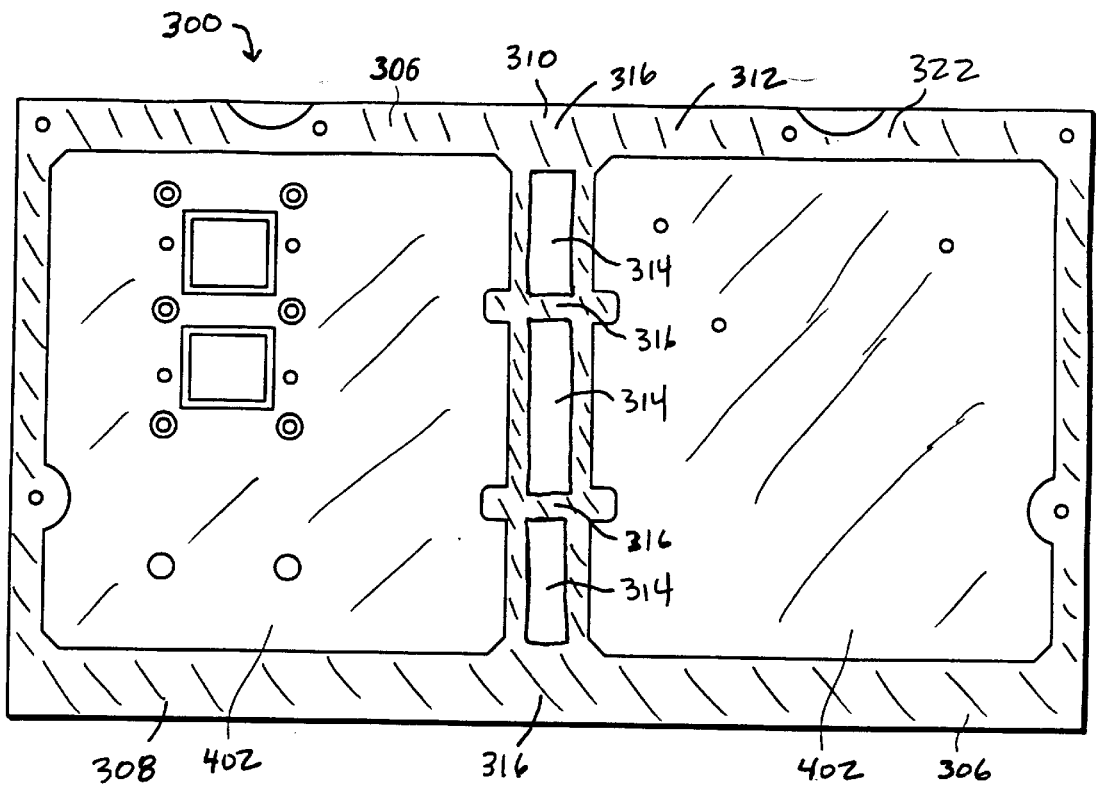
FIG. 6 is a top view of the rigidizer of FIG. 3, prior to being bent, with an adhesive applied to the rigidizer in accordance with an embodiment of the present invention.

FIG. 6 is a top view of rigidizer 306 prior to being bent and with adhesive 402 applied to surface 322 of rigidizer 306 in accordance with an embodiment of the present invention. As depicted in FIG. 6, first partition 308 of rigidizer 306 is interconnected to second partition 312 by the multiple bridges 316 included in third partition 310. FIG. 6 further illustrates the multiple apertures 314 of third partition 310 that facilitate a 'U'-shaped fold in circuit substrate 304 when the substrate and rigidizer are bent.

Figure 7:
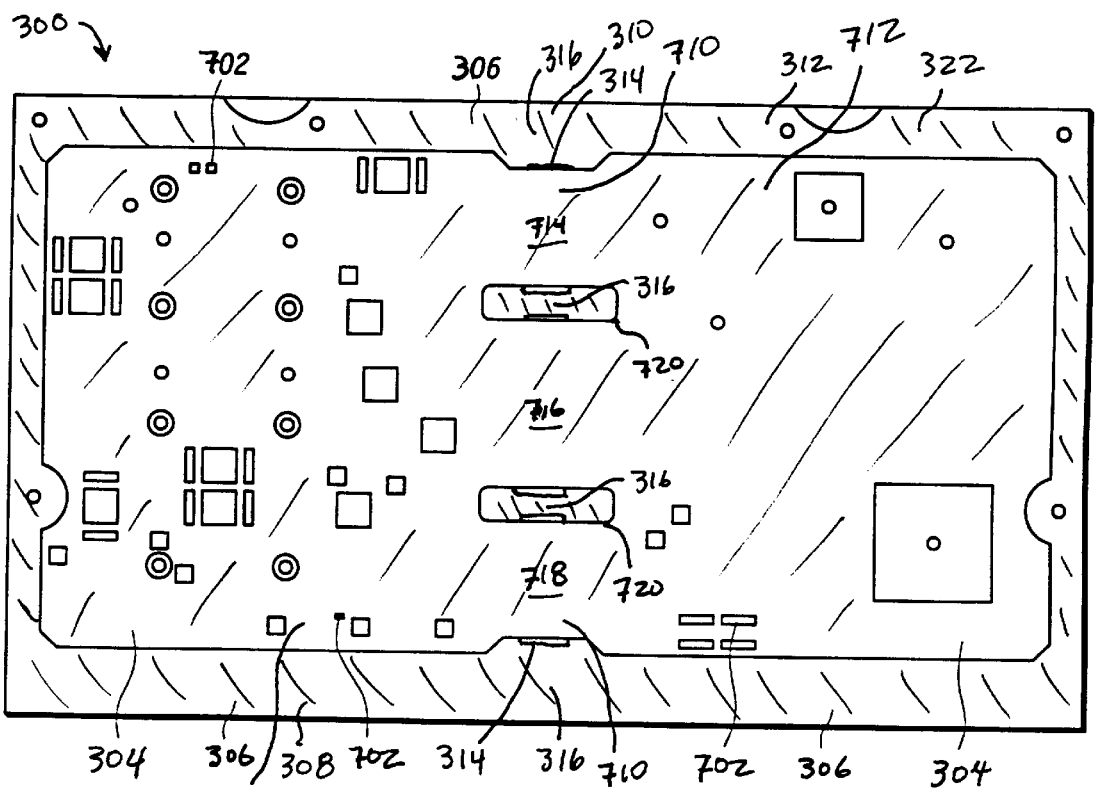
FIG. 7 is a top view of the electronic control unit of FIG. 3 prior to being bent and after a circuit substrate is mounted on the rigidizer and solder paste has been screened onto the substrate in accordance with an embodiment of the present invention.

FIG. 7 is a top view of electronic control unit 300 after circuit substrate 304 is mounted flat on adhesive 402, and thereby on rigidizer 306, and after solder paste 702 has been screened onto the substrate in accordance with an embodiment of the present invention. Preferably components 302 are surface mountable components that may be auto-placed on circuit substrate 304. Those who are of ordinary skill in the art realize that components 302 need not be surface mountable. For example, components 302 may be through-hole parts that may be manually placed on circuit substrate 304. However, by using a liquid adhesive 402 that may be screened on rigidizer 306 and further using surface mountable components 302, a process of assembling electronic control unit 300 may be completely automated.

As depicted in FIG. 7, circuit substrate 304 includes a first partition 708 that is disposed adjacent to first partition 308 of rigidizer 306, a second, flexible circuit partition 710 that is disposed adjacent to second partition 310 of rigidizer 306, and a third partition 712 that is disposed adjacent to third partition 312 of rigidizer 306. Second partition 710 of circuit substrate 304 interconnects first partition 708 and third partition 712. Furthermore, second partition 710 is divided in multiple, preferably three, sections 714, 716, and 718 that each overlay one of the multiple apertures 314 of rigidizer 306, and further includes multiple cutout sections 720 that overlay each of the multiple bridges 316 of rigidizer 306.

Referring now to FIGS. 3, 4, and 7, when circuit substrate 304 and rigidizer 306 are folded, at least a portion 320 of each of the three, sections 714, 716, 718 of second partition 710 of substrate 304 extend into or through apertures 314, and thereby extend beyond the interior region 318 of rigidizer 306. By allowing circuit substrate 304 to extend beyond interior region 318 when the substrate 304 and rigidizer 306 are folded, apertures 314 facilitate a 'U'-shaped folding of circuit substrate 304. The 'U'-shaped fold results in a larger radius of curvature 404 bend in the folded circuit substrate 304 than the radius of curvature 210 bend in the 'W'-shaped, or serpentine, flexible circuit 206 of the prior art electronic control module 100, thereby reducing the cracking and splitting that occurs when flexible circuit 206 of the prior art module 100 is bent.

Figure 8:
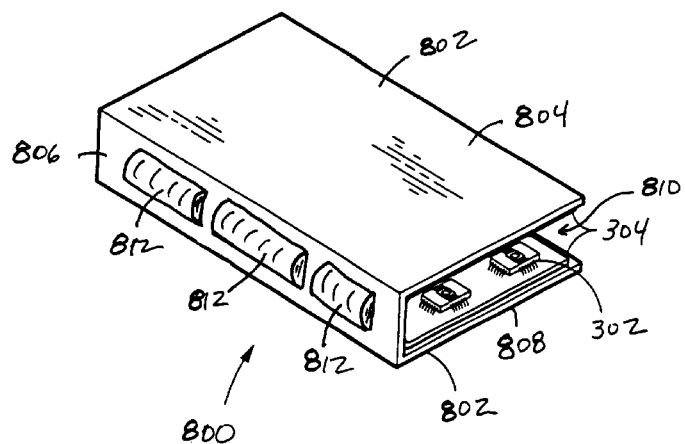
FIG. 8 is an isometric perspective of an end view of an electronic control unit in accordance with another embodiment of the present invention.
Figure 9:
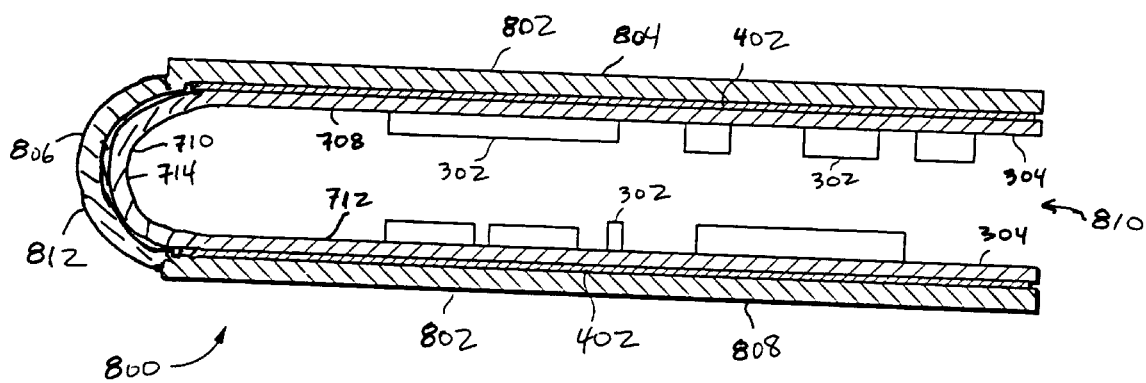
FIG. 9 is a cross-sectional perspective of a side view of the electronic control unit of FIG. 8 in accordance with another embodiment of the present invention.

Referring now to FIGS. 8 and 9, an electronic control unit 800 for housing a flexible circuit board is illustrated in accordance with another embodiment of the present invention. FIG. 8 is an end view of electronic control unit 800 from an isometric perspective. FIG. 9 is a cross-sectional side view of electronic control unit 800. Similar to electronic control unit 300, electronic control unit 800 includes a circuit substrate 304 mounted to a rigidizer 802 and multiple components 302 mounted to circuit substrate 304. Also, similar to control unit 300, a folding of electronic control unit 800 results in a first partition 804 of rigidizer 802 that faces an opposite, third partition 808 of rigidizer 802. The first and third partitions 804 and 808 are interconnected by a second partition 806 of rigidizer 802 that together with the first and third partitions 804 and 808 defines an interior region 810 of rigidizer 802.

Instead of the multiple apertures 314 of rigidizer 306, rigidizer 802 includes at least one and preferably multiple depressions 812 in second partition 806 for receiving the 'U'-shaped folds in circuit substrate 304 when rigidizer 802 and substrate 304 are bent. When electronic control unit 800 is bent, second partition 710 of circuit substrate 304 extends into the one or more depressions 812 so that each section 714, 716, 718 of second partition 710 may bend into a 'U'-shape rather than buckling into a 'W'-shape. By providing the one or more depressions 812 in rigidizer 802 instead of the multiple apertures 314 of rigidizer 306, circuit substrate 304 may be completely contained in rigidizer 802 after being bent. By completely containing circuit substrate 304, rigidizer 802 is able to protect substrate 304 and components 302 from elements such as dust, water, and other chemicals with the need for an end cap such as end cap 322.

Figure 10:
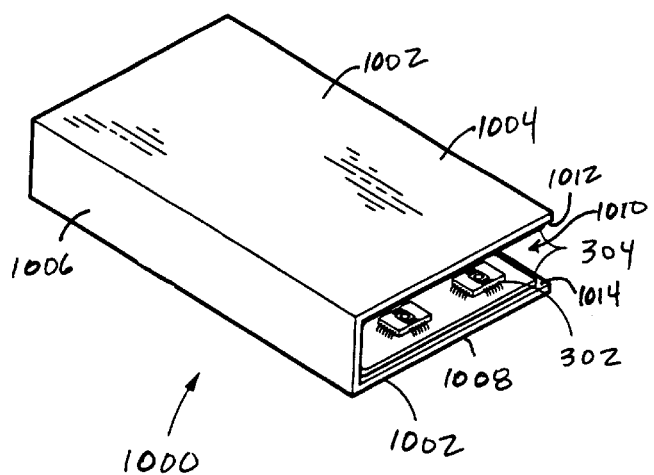
FIG. 10 is an isometric perspective of an end view of an electronic control unit in accordance with another embodiment of the present invention.
Figure 11:
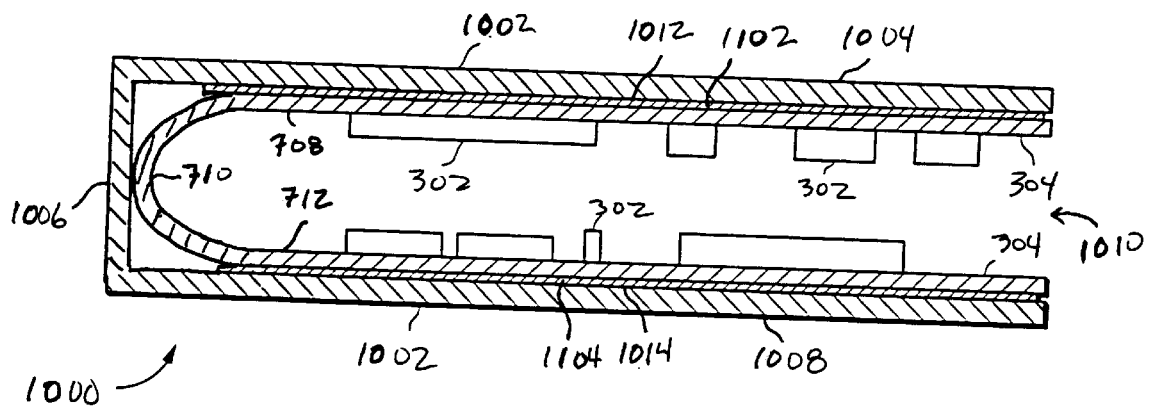
FIG. 11 is a cross-sectional perspective of a side view of the electronic control unit of FIG. 10 in accordance with another embodiment of the present invention.

Referring now to FIGS. 10 and 11, an electronic control unit 1000 for housing a flexible circuit board is illustrated in accordance with yet another embodiment of the present invention. FIG. 10 is an end view of electronic control unit 1000 from an isometric perspective. FIG. 11 is a cross-sectional side view of electronic control unit 1000. Similar to electronic control unit 300, electronic control unit 1000 includes a circuit substrate 304 mounted to a rigidizer 1002 and multiple components 302 mounted to circuit substrate 304. Also, similar to control unit 300, a folding of control unit 1000 results in a first partition 1004 of rigidizer 1002 that faces an opposite, third partition 1008 of rigidizer 1002. The first and third partitions 1004 and 1008 are interconnected by a second partition 1006 of rigidizer 1002 that together with the first and third partitions 804 and 808 defines an interior region 1010 of rigidizer 1002.

Instead of the multiple apertures 314 of rigidizer 306, or the multiple depressions 812 of rigidizer 802, electronic control unit 1000 facilitates a 'U'-shaped bend in circuit substrate 304 through application of a first adhesive 1102 to a surface 1012 of first partition 1004 of rigidizer 1002 and a second, low shear adhesive 1104 to a surface 1014 of third partition 1008. Low shear adhesives are known in the art and typically comprise an acrylic pressure sensitive adhesive to which a mica filler is added. The mica allows for slippage in the shear direction but resists peeling in tension. When electronic control unit 1000 is bent, low shear adhesive 1104 allows third partition 712 of circuit substrate 304 to slide along low shear adhesive 1104 and surface 1014 of third partition 1008 of rigidizer 1002 while first partition 708 of circuit substrate 304 is non-slidably affixed to first partition 1004 of rigidizer 1002. By allowing third partition 712 of circuit substrate 304 to slide along surface 1014, the difference between a radius of the bend in rigidizer 1002 and the radius of the bend in circuit substrate 304 may be taken up by the shift in position of third partition 712. By using a low shear adhesive 1104 that allows third partition 712 of circuit substrate 304 to slide along surface 1014 of third partition 1008 of rigidizer 1002, circuit substrate 304 may be completely contained in rigidizer 1002 after being bent.

In another embodiment of electronic control unit 1000, instead of applying a first adhesive to surface 1010 of first partition 1004 and a second, low shear adhesive to surface 1014, adhesives 1102 and 1104 may each be a dual cure adhesive, such as a B-stage epoxy. Dual cure liquid adhesives that are curable by ultraviolet radiation as well as by heat are available from Hernon Manufacturing, Inc., of Sanford, Fla. Dual cure adhesives may be cured in multiple stages, wherein an earlier curing stage of the multiple stages makes the adhesive tacky to facilitate a mounting of circuit substrate 304 to rigidizer 1002 and a later curing stage of the multiple stages firmly secures the substrate to the rigidizer.

Prior to applying circuit substrate 304 to adhesives 1102 and 1104, and thereby to rigidizer 1002, a first cure, such as an ultraviolet cure, may be applied to adhesive 1102. After applying circuit substrate 304 to adhesives 1102 and 1104, a second cure, preferably a heat cure, is applied to each of adhesives 1102 and 1104, firmly affixing the circuit substrate to adhesive 1102 and first partition 1004 of rigidizer 1002 but slidably affixing the circuit substrate to adhesive 1104 and third partition 1008. Circuit substrate 304 and rigidizer 1002 are then folded or bent and a third cure may be applied to the folded electronic control unit 1000 so as to firmly affix the circuit substrate to both first rigidizer partition 1004 and third rigidizer partition 1008. Alternatively, if both of adhesive 1102 and adhesive 1104 are tacky prior to application of a cure, only adhesive 1102 may be cured prior to the folding of circuit substrate 304 and rigidizer 1002, and then both adhesives 1102, 1104 may be further cured after the folding.

Figure 12:
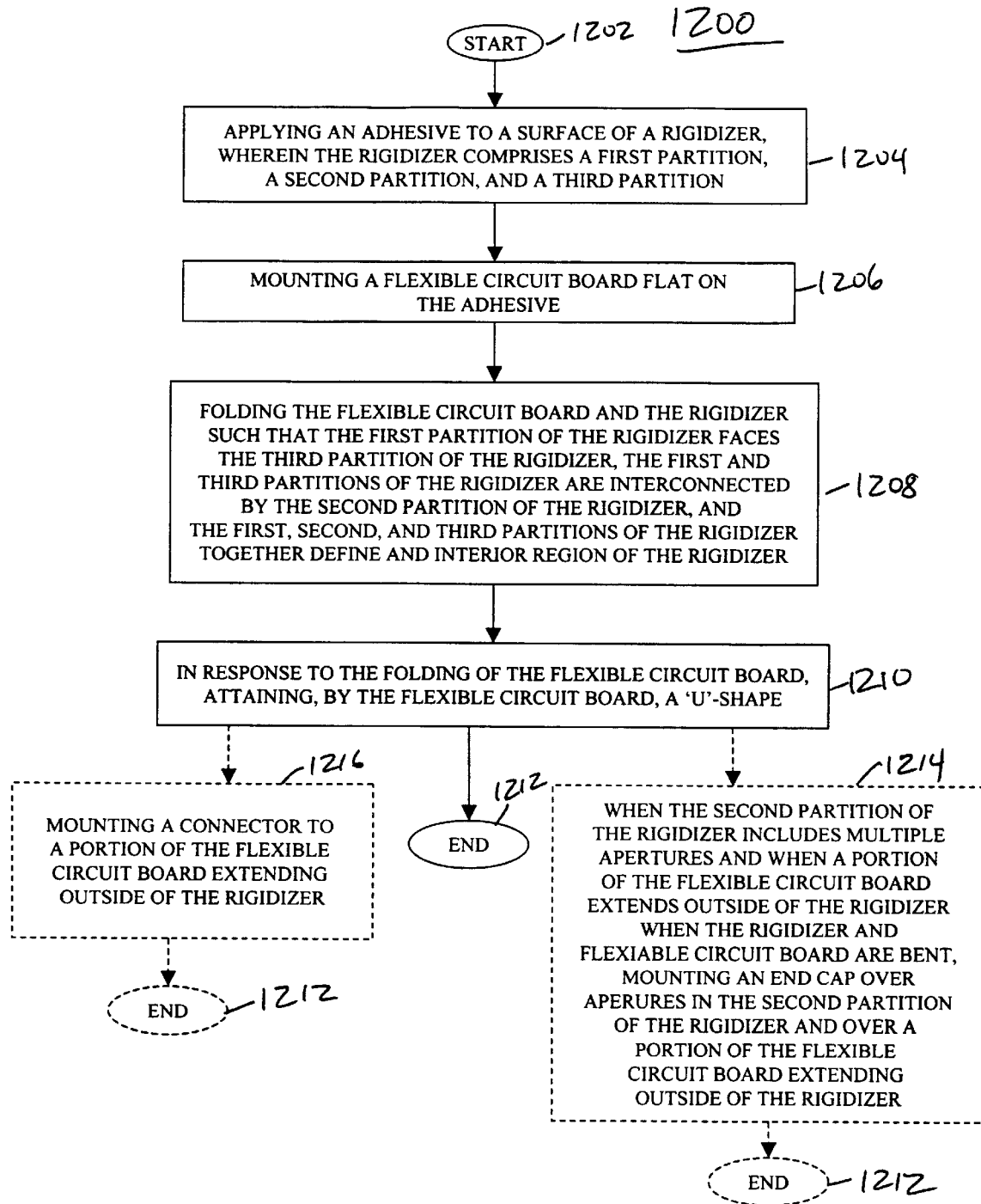
FIG. 12 is a logic flow diagram of a process of assembling an electronic control assembly that includes a rigidizer and a flexible circuit board in accordance with an embodiment of the present invention.
Figure 1:
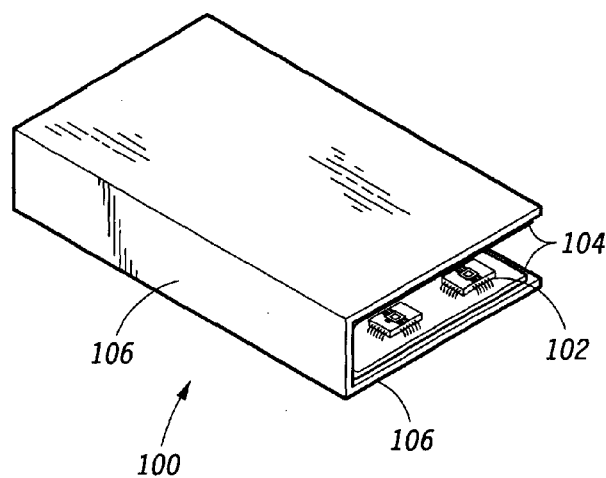
Figure 2:
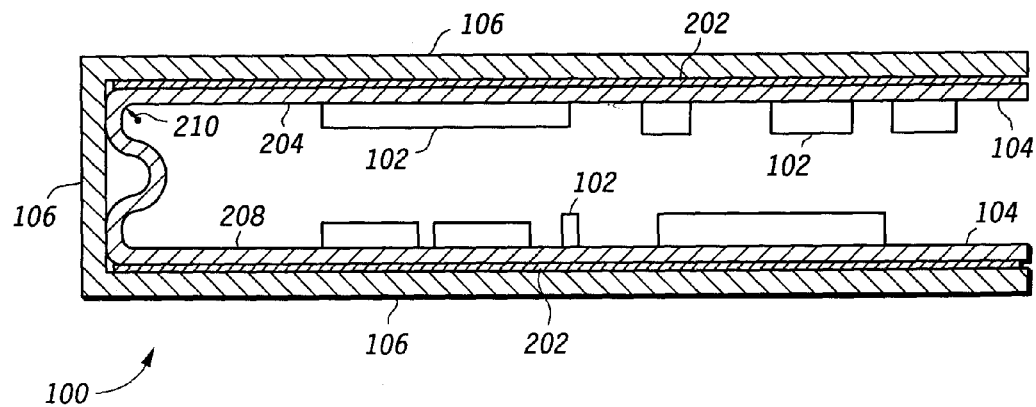
Figure 3:
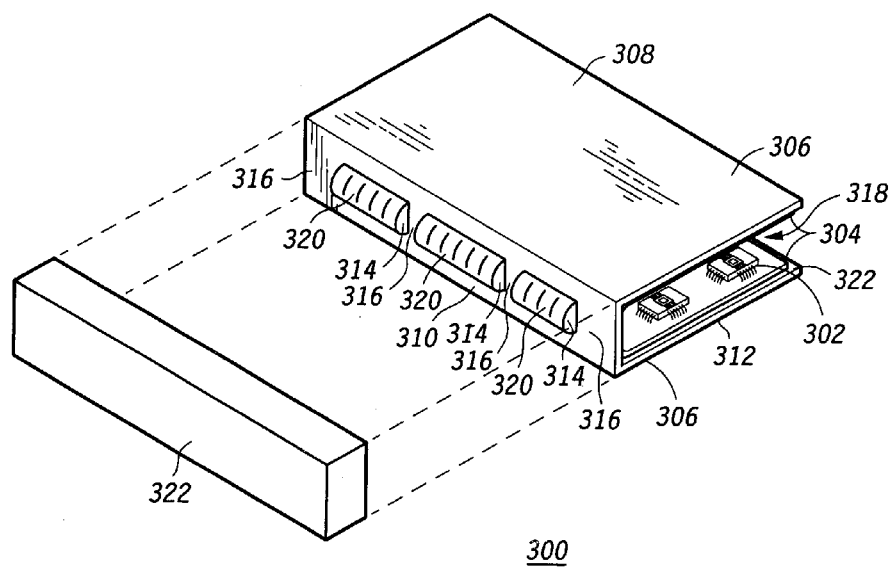
Figure 4:
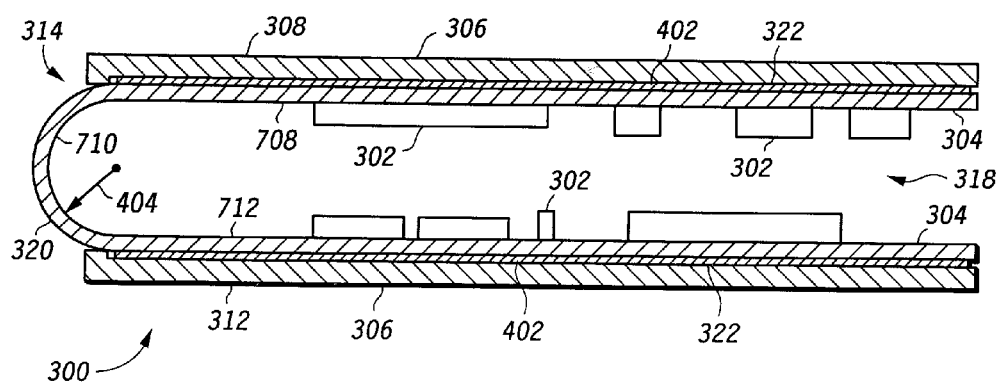
Figure 5:
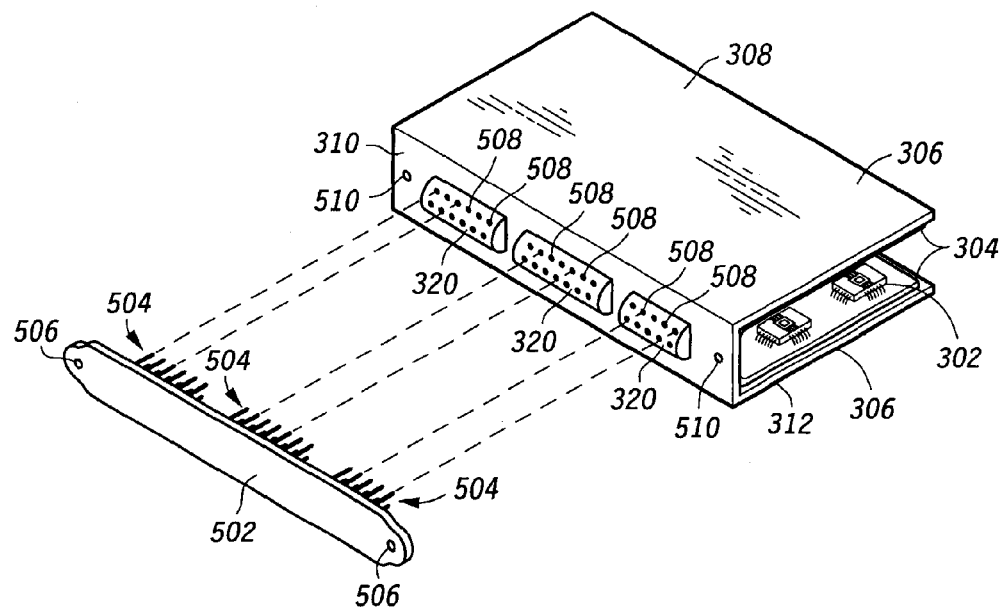
Figure 6:
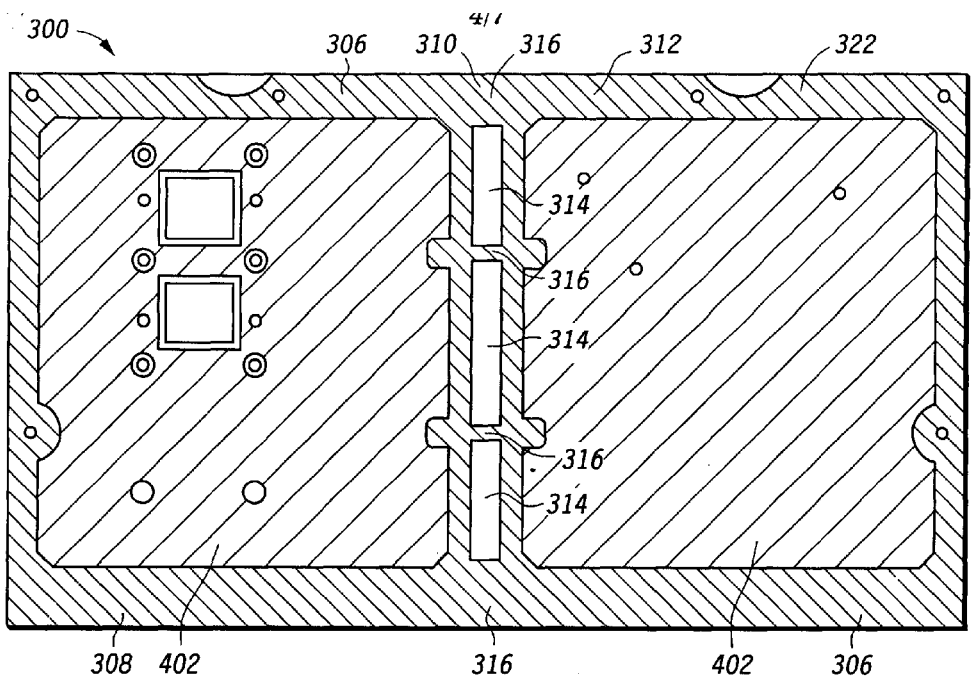
Figure 7:
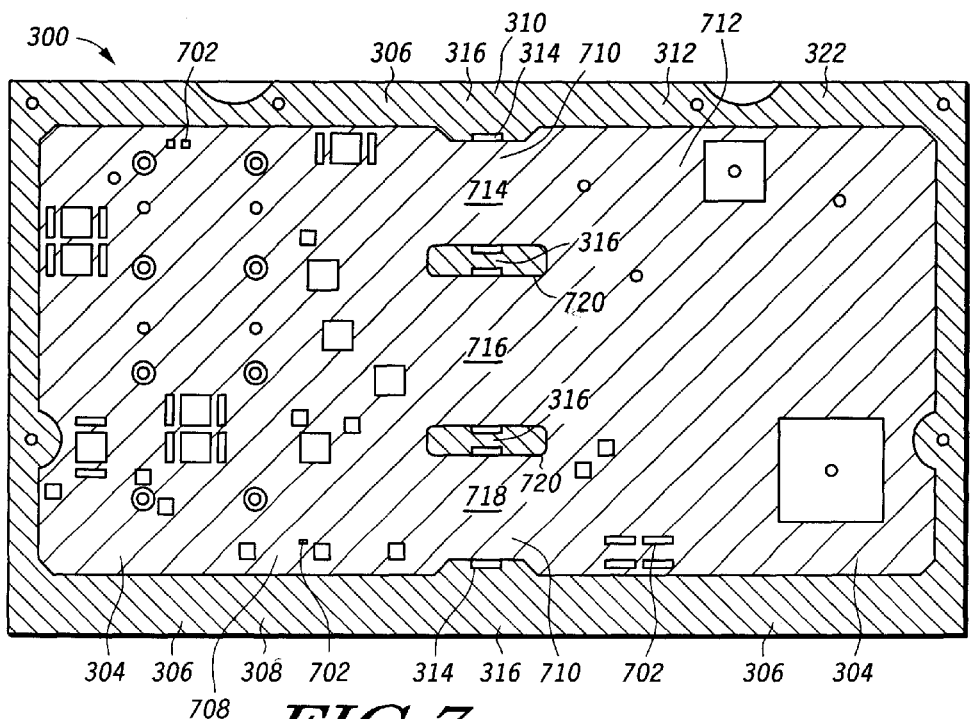
Figure 8:
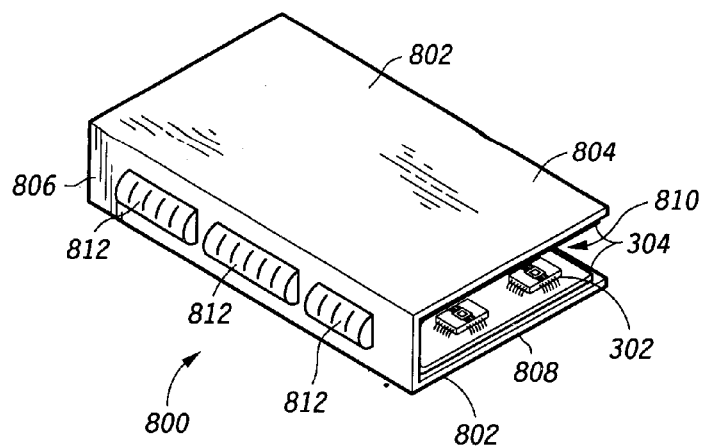
Figure 9:
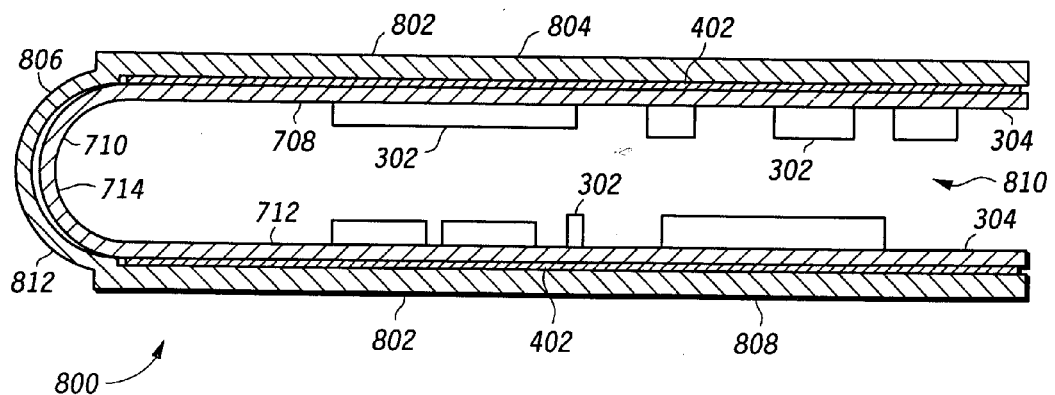
Figure 10:
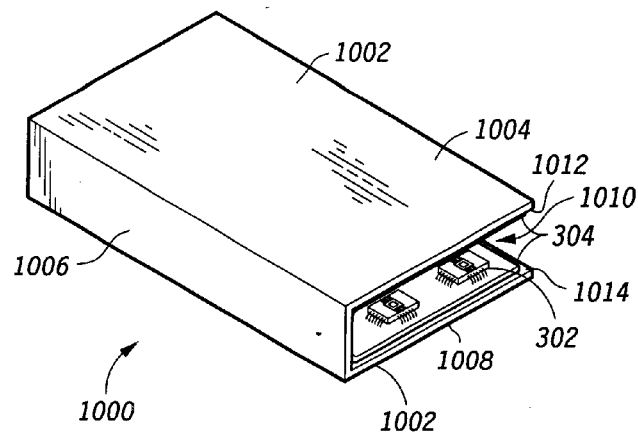
Figure 11:
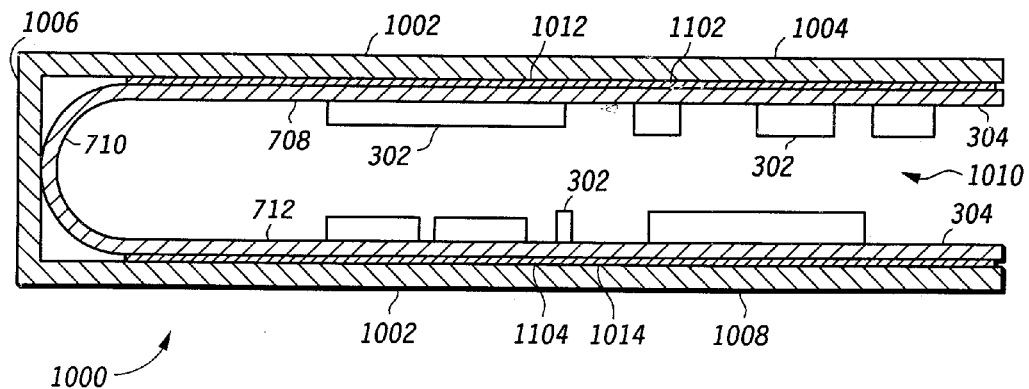
Figure 12:
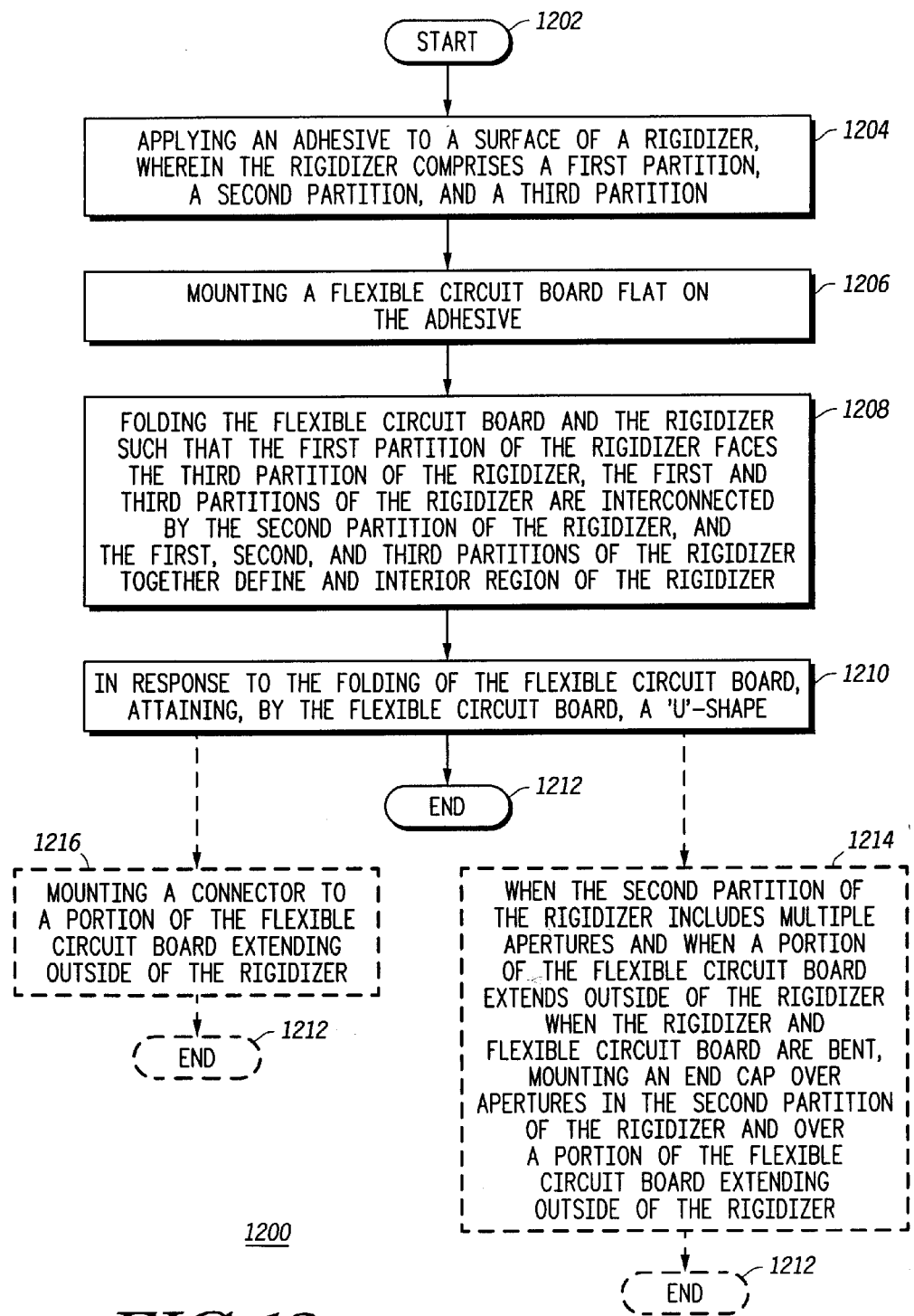
Figure 1:
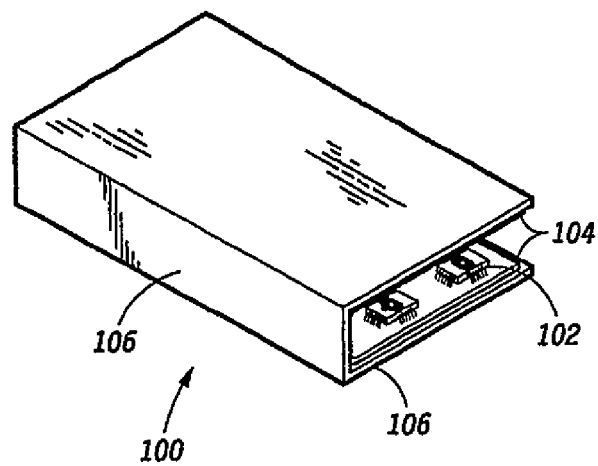
Figure 2:
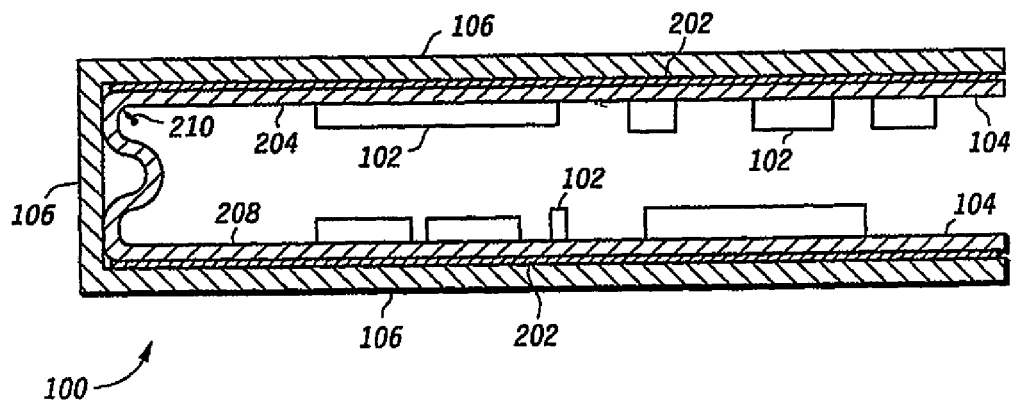
Figure 3:
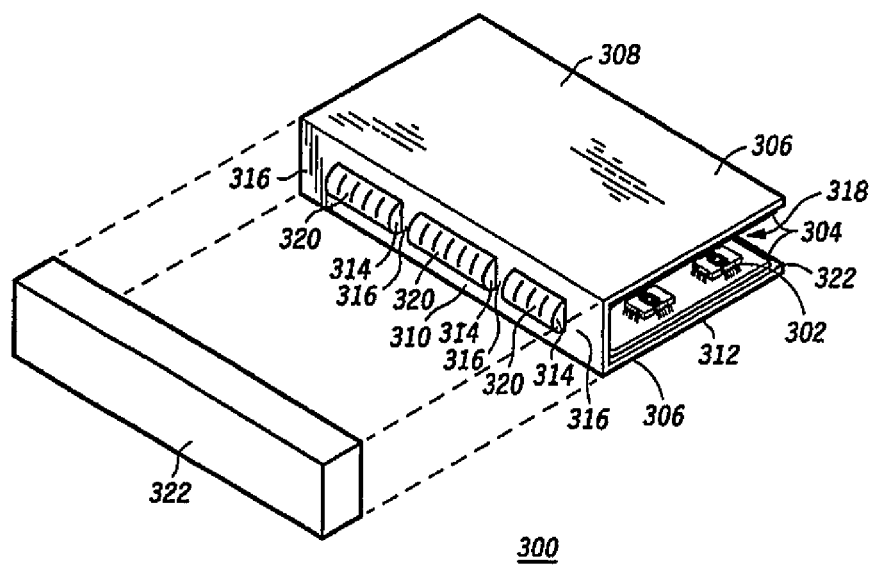
Figure 4:
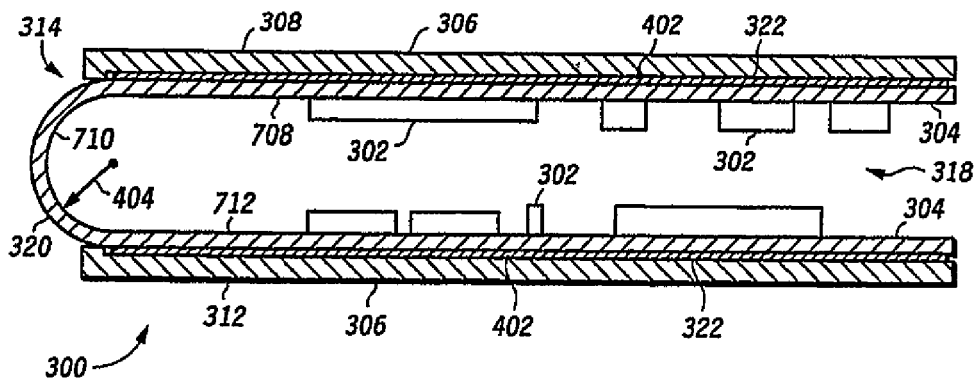
Figure 5:
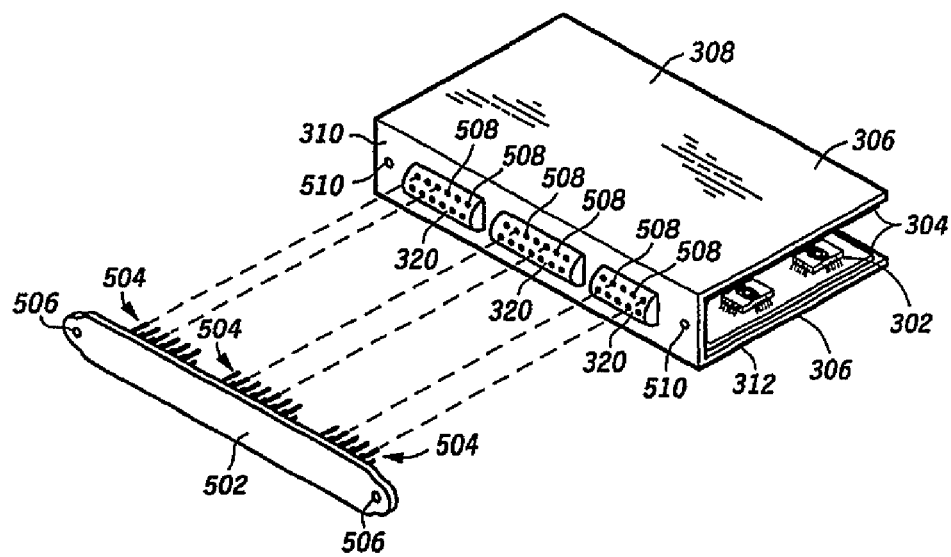
Figure 6:
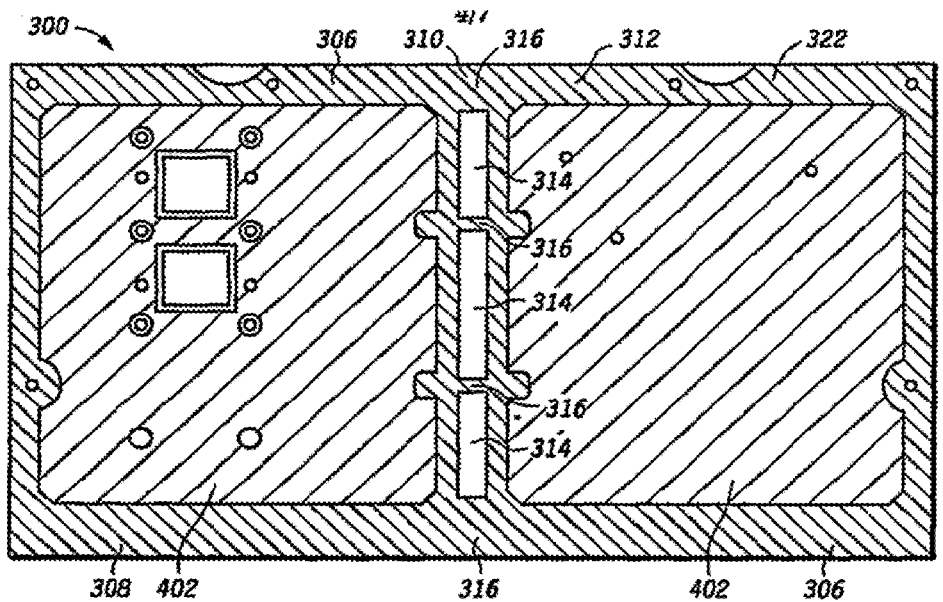
Figure 7:
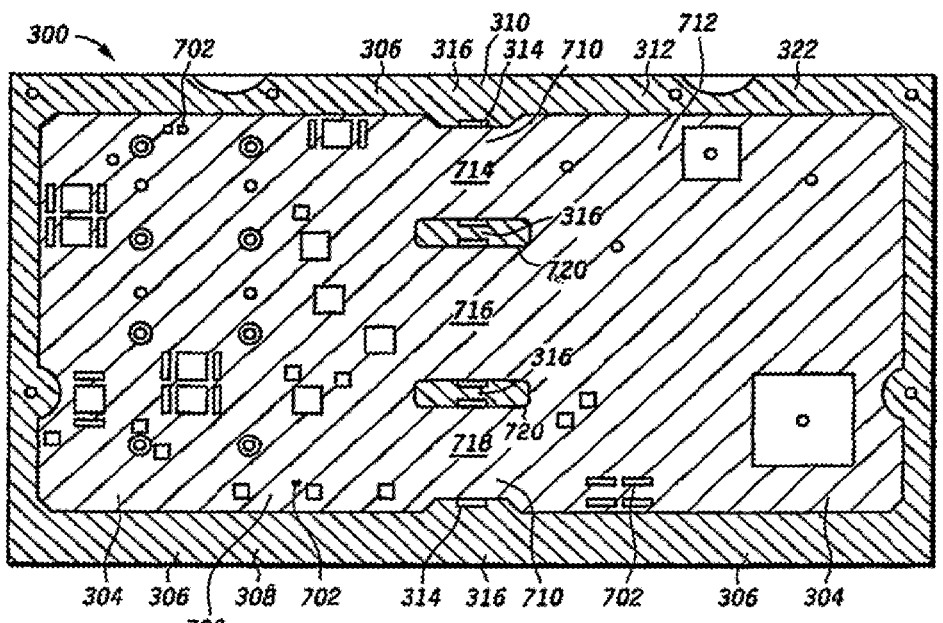
Figure 8:
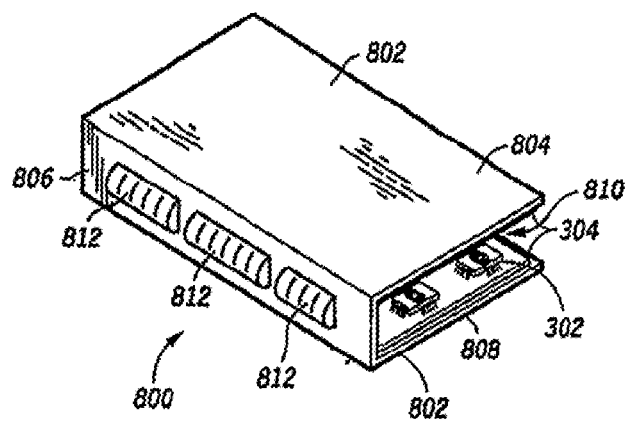
Figure 9:
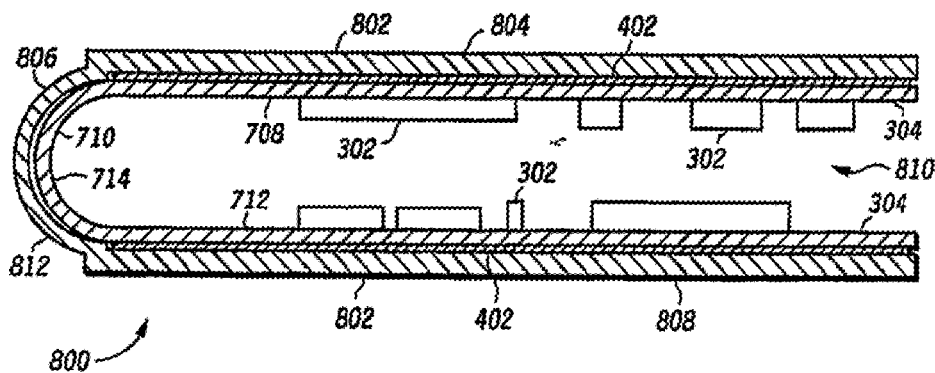
Figure 10:
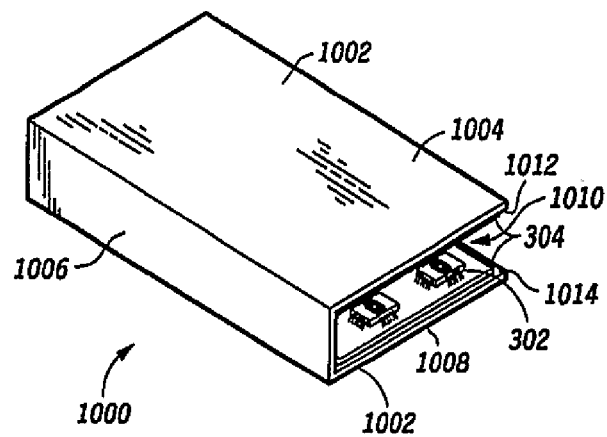
Figure 11:
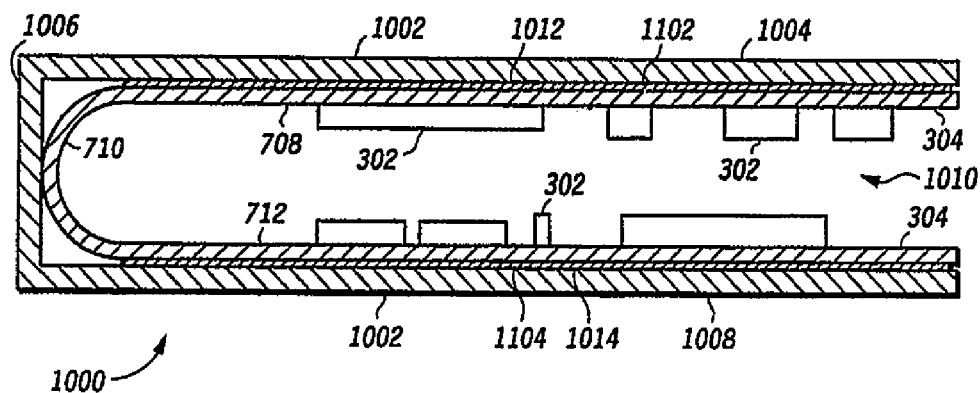
Figure 12:
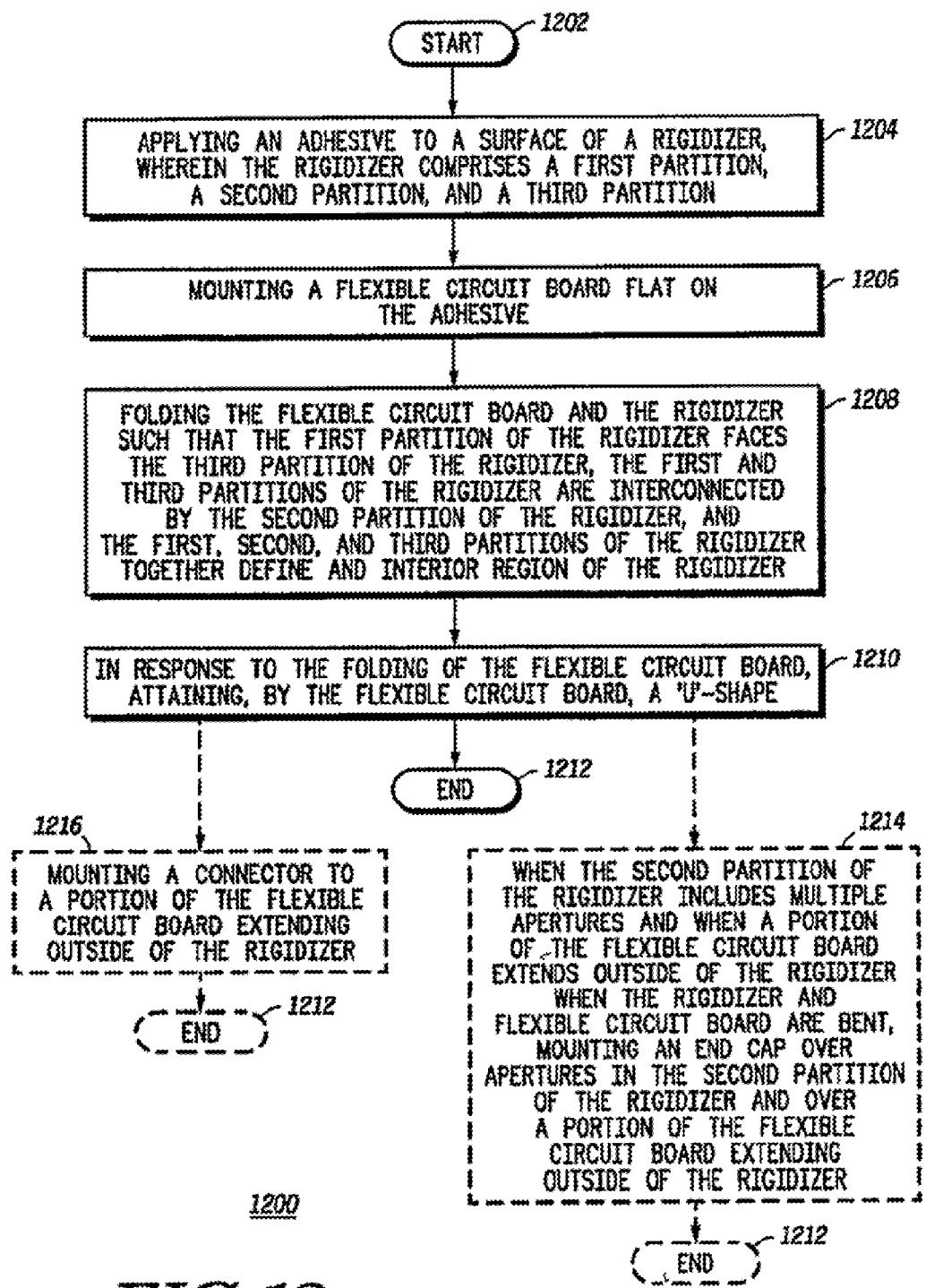

FIG. 12 is a logic flow diagram 1200 of a process of assembling an electronic control assembly that includes a rigidizer and a flexible circuit board in accordance with an embodiment of the present invention. Logic flow diagram 1200 begins (1202) when an adhesive is applied (1204) to a surface of the rigidizer. The rigidizer comprises a first partition, a second partition, and a third partition, wherein the first and third partitions are interconnected by the second partition. The flexible circuit board is then mounted (1206) flat on the adhesive and thereby on the surface of the rigidizer. The flexible circuit board and the rigidizer are then folded (1208) such that the first partition of the rigidizer faces the third partition of the rigidizer and the first, second, and third partitions of the rigidizer together define an interior region of the rigidizer. In response to the folding of the flexible circuit board and the rigidizer, the second partition of the folded flexible circuit board attains (1210) a 'U'-shape, and the logic flow ends (1212).

In one embodiment of the present invention, the second partition of the rigidizer includes multiple apertures and further includes multiple bridges that interconnect the first partition to the third partition. In addition, the flexible circuit board includes first and third partitions that are interconnected by a second, flexible partition. The step of mounting (1206) the flexible circuit board on the rigidizer then includes a step of mounting the flexible circuit board on the rigidizer such that the first partition of the flexible circuit board overlays the first partition of the rigidizer, the third partition of the flexible circuit board overlays the third partition of the rigidizer, and the second partition of the flexible circuit board overlays the multiple apertures the second partition of the rigidizer. The step of attaining (1210), by the folded flexible circuit board, a 'U'-shape then includes a step of extending, by the second partition of the flexible circuit board and in response to the step of folding, beyond the interior region of the rigidizer via the multiple apertures, thereby facilitating a 'U'-shaped fold in the second partition of the flexible circuit board.

In another embodiment of the present invention, an end cap may be mounted (1214) on the rigidizer over the apertures and the portion of the flexible circuit board that extends outside of the apertures. In still another embodiment of the present invention, a connector that includes multiple pins is mounted (1216) on the portion of the flexible circuit board that extends outside of the apertures. In turn, the portion of the flexible circuit board that extends outside of the apertures includes multiple connecting holes for the purpose of receiving the multiple pins of the connector.

In yet another embodiment of the present invention, the second partition of the rigidizer includes at least one depression instead of the multiple apertures. The step of mounting (1206) the flexible circuit board on the rigidizer then includes a step of mounting the flexible circuit board on the rigidizer such that the first partition of the flexible circuit board overlays the first partition of the rigidizer, the third partition of the flexible circuit board overlays the third partition of the rigidizer, and the second partition of the flexible circuit board overlays the at least one depression in the second partition of the rigidizer. The step of attaining (1210), by the folded flexible circuit board, a 'U'-shape then includes a step of extending, by the second partition of the flexible circuit board and in response to the step of folding, into the depression in the second partition of the rigidizer, thereby facilitating a 'U'-shaped fold in the second partition of the flexible circuit board.

In still another embodiment of the present invention, the step of applying (1204) an adhesive to a surface of the rigidizer includes a step of applying a first adhesive to a surface of the first partition of the rigidizer and a second, low shear adhesive to a surface of the third partition of the rigidizer. Alternatively, instead of applying a first adhesive to the surface of the first partition of the rigidizer and a second, low shear adhesive to the surface of the third partition of the rigidizer, the same adhesive may be applied to surfaces of each of the first and third partitions of the rigidizer. A first cure is then applied to the first adhesive and a second, different cure is applied to the second adhesive such that the first partition of the flexible circuit board may be non-slidably mounted to the surface of the first partition of the rigidizer and the third partition of the flexible circuit board may be slidably mounted to the surface of the third partition of the rigidizer.

The step of mounting (1206) the flexible circuit board flat on the adhesive then includes a step of mounting the flexible circuit board flat on the adhesive such that the first partition of the flexible circuit board is non-slidably mounted on the first adhesive and the third partition of the flexible circuit board is slidably mounted on the second, low shear adhesive adhesive. The step of attaining (1210), by the folded flexible circuit board, a 'U'-shape then includes a step of sliding, by the third partition of the flexible circuit board, along the low shear adhesive and the third partition of the rigidizer, thereby facilitating a 'U'-shaped fold in the second partition of the flexible circuit board.

By facilitating a U-shaped fold in circuit substrate 304, as compared to the 'W'-shaped, or serpentine, fold of circuit substrate 104 of prior art electronic control unit 100, electronic control units 300, 800, and 1000 permit a larger radius of curvature bend in a flexible circuit portion of circuit substrate 304 as compared to a radius of curvature bend in a similarly-sized electronic module 100. The larger radius of curvature bend greatly reduces the rate of splitting and cracking of the flexible circuit portion when circuit substrate 304 is bent. Electronic control units 300, 800, and 1000 each includes a flexible circuit substrate 304 having a first partition 708 interconnected to a third partition 712 by a second, flexible partition 710. Each electronic control unit 300, 800, and 1000 further includes a respective rigidizer 306, 802, 1002 having a respective first partition 308, 804, 1004 interconnected to a respective third partition 312, 808, 1008 by a respective second partition 310, 806, 1006. When each electronic control unit 300, 800, 1000 is twice folded, the circuit substrate 304 included in the unit assumes an approximate 'U'-shape, resulting in a lower cracking and splitting rate than the prior art 'W'-shaped fold.

In one embodiment of the present invention, second rigidizer partition 310 includes multiple bridges 316 that interconnect the first and third rigidizer partitions 308, 312 and multiple apertures 314 that allow at least a portion of the flexible circuit substrate partition 710 to extend beyond an interior region 318 of rigidizer 306, and thereby assume a 'U'-shape, when electronic control unit 300 is folded. In another embodiment of the present invention, a second rigidizer partition 806 includes at least one depression 812 that allows at least a portion of flexible circuit substrate partition 710 to assume a 'U'-shape when electronic control unit 800 is folded. In yet another embodiment of the present invention, a first circuit substrate partition 708 is non-slidably affixed to a first rigidizer partition 1004 by a first adhesive 1102 and a third circuit substrate partition 712 is slidably affixed to a third rigidizer partition 1008 by a second adhesive 1104. Second adhesive 1104 is a low shear adhesive that allows third circuit substrate partition 712 to slide along the third rigidizer partition 1008 when electronic control unit 1000 is folded, thereby facilitating a 'U'-shaped flexible circuit substrate partition 710. Alternatively, adhesives 1102 and 1104 may each be subjected to different cures prior to a mounting of circuit substrate 304 on rigidizer 1002, resulting in first circuit substrate partition 708 being non-slidably affixed to first rigidizer partition 1004 and third circuit substrate partition 712 being slidably affixed to third rigidizer partition 1008.

While the present invention has been particularly shown and described with reference to particular embodiments thereof, it will be understood by those skilled in the art that various changes may be made and equivalents substituted for elements thereof without departing from the spirit and scope of the invention. In addition, many modifications may be made to adapt a particular situation or material to the teachings of the invention without departing from the essential scope thereof. Therefore, it is intended that the invention not be limited to the particular embodiments disclosed herein, but that the invention will include all embodiments falling within the scope of the appended claims.

What is claimed is:

1. An electronic control unit comprising:
    a rigidizer comprising a first rigidizer partition and a third rigidizer partition interconnected by a second rigidizer partition, wherein the second rigidizer partition comprises a plurality of apertures and a plurality of bridges that interconnect the first and third rigidizer partitions;
    a flexible circuit board comprising a first circuit board partition and a third circuit board partition that are interconnected by a second, flexible circuit board partition, wherein the first circuit board partition is affixed to a surface of the first rigidizer partition by a first adhesive, and wherein the third circuit board partition is affixed to a surface of the third rigidizer partition by a second adhesive; and
    wherein the electronic control unit is folded such that the first rigidizer partition faces the third rigidizer partition and the first rigidizer partition, the second rigidizer partition, and the third rigidizer partition together define an interior region of the rigidizer, and wherein the second circuit board partition attains a 'U'-shape as a result of the folding by extending beyond the interior region of the rigidizer via the plurality of apertures in the second rigidizer partition.

2. The electronic control unit of claim 1, further comprising an end cap that is disposed over the apertures in the second rigidizer partition.

3. The electronic control unit of claim 1, wherein the second circuit board partition comprises a plurality of connecting holes for receiving a plurality of conductive pins and wherein the electronic control unit further comprises a connector comprising a plurality of electrically conductive pins, wherein the connector is disposed adjacent to the second circuit board partition and wherein each connecting hole of the plurality of connecting holes receives a conductive pin of the plurality of conductive pins.

4. The electronic control unit of claim 3, wherein the rigidizer further comprises a first plurality of mating apertures and wherein the connector further comprises a second plurality of mating apertures, and wherein the first plurality of mating apertures align with the second plurality of mating apertures when the connector is disposed adjacent to the second circuit board partition.

5. An electronic control unit comprising:
   a rigidizer comprising a first rigidizer partition and a third rigidizer partition interconnected by a second rigidizer partition, wherein the second rigidizer partition comprises a substantially flat base and at least one depression, the substantially flat base defining a plane and the at least one depression extending from the substantially flat base in a direction perpendicular to the plane defined by the substantially flat base;
   a flexible circuit board comprising a first circuit board partition and a third circuit board partition that are interconnected by a second, flexible circuit board partition, wherein the first circuit board partition is affixed to a surface of the first rigidizer partition by a first adhesive, and wherein the third circuit board partition is affixed to a surface of the third rigidizer partition by a second adhesive; and
   wherein the electronic control unit is folded such that the first rigidizer partition faces the third rigidizer partition and the first rigidizer partition, the second rigidizer partition, and the third rigidizer partition together define an interior region of the rigidizer, and wherein the second circuit board partition attains a 'U'-shape as a result of the folding by extending through the plane defined by the substantially flat base and into the at least one depression in the second rigidizer partition.

6. The electronic control unit of claim 5, wherein the second rigidizer partition has a plurality of depressions, each depression formed to extend in a direction perpendicular to the plane defined by the substantially flat base.

7. An electronic control unit comprising:
   a rigidizer comprising a first rigidizer partition and a third rigidizer partition interconnected by a second rigidizer partition;
   a flexible circuit board comprising a first circuit board partition and a third circuit board partition that are interconnected by a second, flexible circuit board partition, wherein the first circuit board partition is non-slidably affixed to a surface of the first rigidizer partition by a first adhesive during a folding period of the electronic control unit, and wherein the third circuit board partition is slidably affixed to a surface of the third rigidizer partition by a second adhesive during the folding period of the electronic control unit; and
   wherein the electronic control unit is folded during the folding period such that the first rigidizer partition faces the third rigidizer partition and the first rigidizer partition, the second rigidizer partition, and the third rigidizer partition together define an interior region of the rigidizer, and wherein the second circuit board partition attains a 'U'-shape when the third circuit board partition slides along the surface of the third rigidizer partition during the folding period.

8. The electronic control unit of claim 7, wherein the first adhesive is different from the second adhesive and wherein the second adhesive is a low shear adhesive.

9. The electronic control unit of claim 7, wherein the first adhesive is the same as the second adhesive and wherein a first cure is applied to the first adhesive and a second, different cure is applied to the second adhesive prior to the folding period of the electronic control unit.

10. The electronic control unit assembly of claim 7, wherein a cure is applied to the first adhesive and no cure is applied to the second adhesive prior to the folding period of the electronic control unit.

11. A method for assembling an electronic control unit comprising a flexible circuit board and further comprising a rigidizer having a first rigidizer partition, a second rigidizer partition, and a third rigidizer partition, wherein the first and third rigidizer partitions are interconnected by the second rigidizer partition, the second rigidizer partition comprises a plurality of apertures and a plurality of bridges that interconnect the first rigidizer partition to the third rigidizer partition, the flexible circuit board comprises a first circuit board partition and a third circuit board partition that are interconnected by a second, flexible, circuit board partition, the method comprising steps of:
   applying an adhesive to a surface of the rigidizer;
   mounting the flexible circuit board flat on the surface of the rigidizer via the adhesive such that the first circuit board partition overlays the first rigidizer partition, the third circuit board partition overlays the third rigidizer partition, and the second circuit board partition overlays the plurality of apertures in the second rigidizer partition;
   folding the flexible circuit board and the rigidizer such that the first rigidizer partition faces the third rigidizer partition and the first, second, and third rigidizer partitions together define an interior region of the rigidizer; and
   in response to the folding of the flexible circuit board and the rigidizer, attaining, by the folded flexible circuit board, a 'U'-shape in the second circuit board partition that extends beyond the interior region of he rigidizer via the plurality of apertures in the rigidizer.

12. The method of claim 11, further comprising a step of mounting an end cap on the rigidizer over the apertures in the second rigidizer partition and over the second circuit board partition that extends beyond the interior region of the rigidizer via the apertures.

13. The method of claim 11, further comprising a step of mounting a connector on over the apertures in the second rigidizer partition and over at least a portion of second circuit board partition that extends outside of the apertures, wherein the connector comprises a plurality of pins, and wherein the at least a portion of the second circuit board partition that extends outside of the apertures comprises a plurality of connecting holes for the purpose of receiving the plurality of pins of the connector.

14. A method for assembling an electronic control unit comprising a flexible circuit board and further comprising a rigidizer having a first rigidizer partition, a second rigidizer partition, and a third rigidizer partition, wherein the first and third rigidizer partitions are interconnected by the second rigidizer partition, the second rigidizer partition having a substantially flat base and at least one depression, the substantially flat base defining a plane and the at least one depression extending from the substantially flat base in a direction perpendicular to the plane defined by the substantially flat base, the method comprising steps of:

applying an adhesive to a surface of the rigidizer;

mounting the flexible circuit board flat on the surface of the rigidizer via the adhesive such that the first circuit board partition overlays the first rigidizer partition, the third circuit board partition overlays the third rigidizer partition, and the second circuit board partition overlays the at least one depression in the second rigidizer partition;

folding the flexible circuit board and the rigidizer such that the first rigidizer partition faces the third rigidizer partition and the first, second, and third rigidizer partitions together define an interior region of the rigidizer; and in response to the folding of the flexible circuit board and the rigidizer, attaining, by the folded flexible circuit board, a 'U'-shape in the second circuit board partition that extends beyond the plane defined by the substantially flat base and into the at least one depression in the second rigidizer partition.

15. The method of claim 14, wherein step of applying an adhesive to a surface of the rigidizer comprises steps of applying a first adhesive to a surface of the first rigidizer partition and applying a second adhesive to a surface of the second rigidizer partition, wherein the first adhesive is different than the second adhesive, wherein the step of mounting the flexible circuit board flat on the rigidizer comprises a step of non-slidably mounting the first circuit board partition on the first rigidizer partition via the first adhesive and slidably mounting the third circuit board partition on the third rigidizer partition via the second adhesive, and wherein the step of attaining a 'U'-shape comprises a step of the third circuit board partition sliding along the third rigidizer partition when the electronic control unit is folded, thereby facilitating a 'U'-shaped fold in the flexible circuit board.

16. The method of claim 14, wherein the step of applying an adhesive to a surface of the rigidizer comprises steps of applying a first adhesive to a surface of the first rigidizer partition, applying a first cure to the first adhesive, applying a second adhesive to a surface of the second rigidizer partition, and applying a second cure to the second adhesive, wherein the step of mounting the flexible circuit board flat on the rigidizer comprises a step of non-slidably mounting the first circuit board partition on the first rigidizer partition via the first adhesive and slidably mounting the third circuit board partition on the second rigidizer partition via the second adhesive, and wherein the attaining a 'U'-shape comprises a step of the third circuit board partition sliding along the third rigidizer partition when the electronic control unit is folded, thereby facilitating a 'U'-shaped fold in the flexible circuit board.

17. An electronic control unit comprising:

a rigidizer comprising a first rigidizer partition and a third rigidizer partition interconnected by a second rigidizer partition, wherein the second rigidizer partition comprises a substantially flat base, an aperture and at least one integrally formed depression, the substantially flat base defining a plane, the aperture formed within the substantially flat base, the at least one integrally formed depression extending from the aperture in a direction perpendicular to the plane;

a flexible circuit board comprising a first circuit board partition and a third circuit board partition that are interconnected by a second, flexible circuit board partition, wherein the first circuit board partition is affixed to a surface of the first rigidizer partition by a first adhesive, and wherein the third circuit board partition is affixed to a surface of the third rigidizer partition by a second adhesive; and wherein the electronic control unit is folded such that the first rigidizer partition faces the third rigidizer partition and the first rigidizer partition, the second rigidizer partition, and the third rigidizer partition together define an interior region of the rigidizer, and wherein the second circuit board partition attains a 'U'-shape as a result of the folding by extending through aperture and the plane defined by the substantially flat base and into the at least one integrally formed depression in the second rigidizer partition.

18. The electronic control unit of claim 17, wherein the second rigidizer partition has a plurality of apertures and a plurality of integrally formed depressions, each aperture formed within the substantially flat base, each integrally formed depression extending from at least one aperture in a direction perpendicular to the plane.

19. The electronic control unit of claim 17, wherein the first adhesive is different from the second adhesive such that the first circuit board partition is non-slidably affixed to first rigidizer partition during a folding period and the third circuit board is slidably affixed to the surface of the third rigidizer partition during the folding period.

* * * * *

UNITED STATES PATENT AND TRADEMARK OFFICE
CERTIFICATE OF CORRECTION

PATENT NO.   : 6,501,661 B1
DATED        : December 31, 2002
INVENTOR(S)  : Moore et al.

It is certified that error appears in the above-identified patent and that said Letters Patent is hereby corrected as shown below:

Please substitute the attached Formal Drawing sheets 1-7 for the informal drawings shown on pages 2-8 of the issued patent.

Signed and Sealed this

Third Day of June, 2003

JAMES E. ROGAN
*Director of the United States Patent and Trademark Office*

UNITED STATES PATENT AND TRADEMARK OFFICE
CERTIFICATE OF CORRECTION

| | | |
|---|---|---|
| PATENT NO. | : 6,501,661 B1 | Page 1 of 8 |
| APPLICATION NO. | : 10/027443 | |
| DATED | : December 31, 2002 | |
| INVENTOR(S) | : Moore et al. | |

It is certified that error appears in the above-identified patent and that said Letters Patent is hereby corrected as shown below:

Please substitute the attached Formal Drawing sheets 1-7 for the informal drawings shown on pages 2-8 of the issued patent.

Signed and Sealed this

Twenty-seventh Day of March, 2007

JON W. DUDAS
*Director of the United States Patent and Trademark Office*